US012366596B2

(12) United States Patent
Sasaki et al.

(10) Patent No.: US 12,366,596 B2
(45) Date of Patent: Jul. 22, 2025

(54) FAULT DETECTION CIRCUIT

(71) Applicant: TOYOTA JIDOSHA KABUSHIKI KAISHA, Toyota (JP)

(72) Inventors: Yu Sasaki, Kashiwa (JP); Hiroyuki Iyama, Okazaki (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 165 days.

(21) Appl. No.: 18/486,279

(22) Filed: Oct. 13, 2023

(65) Prior Publication Data

US 2024/0151755 A1 May 9, 2024

(30) Foreign Application Priority Data

Nov. 8, 2022 (JP) ................................. 2022-178695

(51) Int. Cl.
*G01R 25/00* (2006.01)
*G01R 31/52* (2020.01)
(52) U.S. Cl.
CPC ........... *G01R 25/005* (2013.01); *G01R 31/52* (2020.01)
(58) Field of Classification Search
None
See application file for complete search history.

(56) References Cited

U.S. PATENT DOCUMENTS

2019/0103768 A1* 4/2019 Uchida ................... H02J 50/80

FOREIGN PATENT DOCUMENTS

| JP | 2012-060758 A | 3/2012 |
| JP | 2017-221006 A | 12/2017 |
| JP | 2019-176606 A | 10/2019 |
| JP | 2019-187201 A | 10/2019 |
| JP | 2020-112510 A | 7/2020 |
| JP | 2021-035068 A | 3/2021 |

* cited by examiner

*Primary Examiner* — Farhana A Hoque
(74) *Attorney, Agent, or Firm* — Oliff PLC

(57) ABSTRACT

A fault detection circuit according to the present disclosure includes a plurality of phase difference detection circuits configured to generate phase difference measurement signals having a pulse width corresponding to a magnitude of a phase difference between two of drive signals of different phases among a plurality of drive signals, a plurality of smoothing circuits configured to smooth the phase difference measurement signals, which have been associated with the smoothing circuits, respectively, in advance, and output phase difference detection voltages each having a voltage value corresponding to the magnitude of the phase difference; and an error detection circuit configured to compare the plurality of phase difference detection voltages and switch abnormality detection signals from a disabled state to an enabled state when there is the phase difference detection voltage having a voltage value exceeding a preset tolerance range.

7 Claims, 11 Drawing Sheets

FAULT DETECTION CIRCUIT

CROSS REFERENCE TO RELATED APPLICATIONS

This application is based upon and claims the benefit of priority from Japanese patent application No. 2022-178695, filed on Nov. 8, 2022, the disclosure of which is incorporated herein in its entirety by reference.

BACKGROUND

The present disclosure relates to a fault detection circuit that detects a fault occurring in a multi-phase power supply.

In switching, which supplies power to a load circuit, the use of multi-phase power supplies for synthesizing power supply current generated by drive signals of different phases and applying it to a load is increasing in order to cope with increased power consumption of the load circuit. In this multi-phase power supply, each phase is required to perform a switching operation with each other with a preset phase difference. A technique related to this multi-phase power supply is disclosed in Japanese Unexamined Patent Application Publication No. 2019-176606.

A switching power supply apparatus described in Japanese Unexamined Patent Application Publication No. 2019-176606 includes a main circuit composed of a plurality of power conversion units having switching elements connected in parallel with each other, a control circuit for outputting a reference pulse signal based on an output of the entire main circuit, an overall current detection circuit for detecting an output current of the entire main circuit as an overall current, a plurality of individual current detection circuits provided corresponding to the plurality of power conversion units and for detecting the output current of each of the plurality of power conversion units as individual current, and a pulse corrector for generating the individual pulse signal of each of the plurality of power conversion units based on the overall current, the individual current, and the reference pulse signal, and outputting the individual pulse signal of each of the plurality of power conversion units to the plurality of power conversion units as a drive signal of the switching element.

SUMMARY

However, in a multi-phase power supply, there is a problem that if any single phase fails, the multi-phase power supply will not operate properly. The switching power supply described in Japanese Unexamined Patent Application Publication No. 2019-176606 has a problem that although it is a multi-phase power supply, it cannot detect an occurrence of a failure in any of a plurality of drive phases for which an operation cannot be corrected.

The present disclosure has been made in view of the above problem and provides a multi-phase power supply with high fault detection capability.

A fault detection circuit according to the present disclosure for detecting an abnormality in drive signals of a plurality of drive circuits, the plurality of drive circuits being configured to drive a load circuit connected in series between an output terminal and ground wiring using the drive signals of different phases includes: a plurality of phase difference detection circuits each configured to generate a phase difference measurement signal having a pulse width corresponding to a magnitude of a phase difference between two of the drive signals of the different phases among the plurality of drive signals; a plurality of smoothing circuits each configured to smooth the phase difference measurement signal, which has been associated with the respective smoothing circuits in advance, and output a phase difference detection voltage having a voltage value corresponding to the magnitude of the phase difference; and an error detection circuit configured to compare the plurality of phase difference detection voltages and switch an abnormality detection signal from a disabled state to an enabled state when there is the phase difference detection voltage having a voltage value exceeding a preset tolerance range.

The fault detection circuit according to the present disclosure detects a fault occurring in each power supply circuit based on the phase difference between the drive signals of the plurality of power supply circuits constituting a multi-phase power supply.

According to the present disclosure, it is possible to provide a multi-phase power supply with high fault detection capability.

The above and other objects, features and advantages of the present disclosure will become more fully understood from the detailed description given hereinbelow and the accompanying drawings which are given by way of illustration only, and thus are not to be considered as limiting the present disclosure.

DESCRIPTION OF EMBODIMENTS

The present disclosure will be described below through the embodiments of the disclosure, but the disclosure set forth in the claims is not limited to the following embodiments. Moreover, not all of the configurations described in the embodiment are essential as means to solve the problem. The embodiments will be described below with reference to the drawings.

First Embodiment

Figure 1:
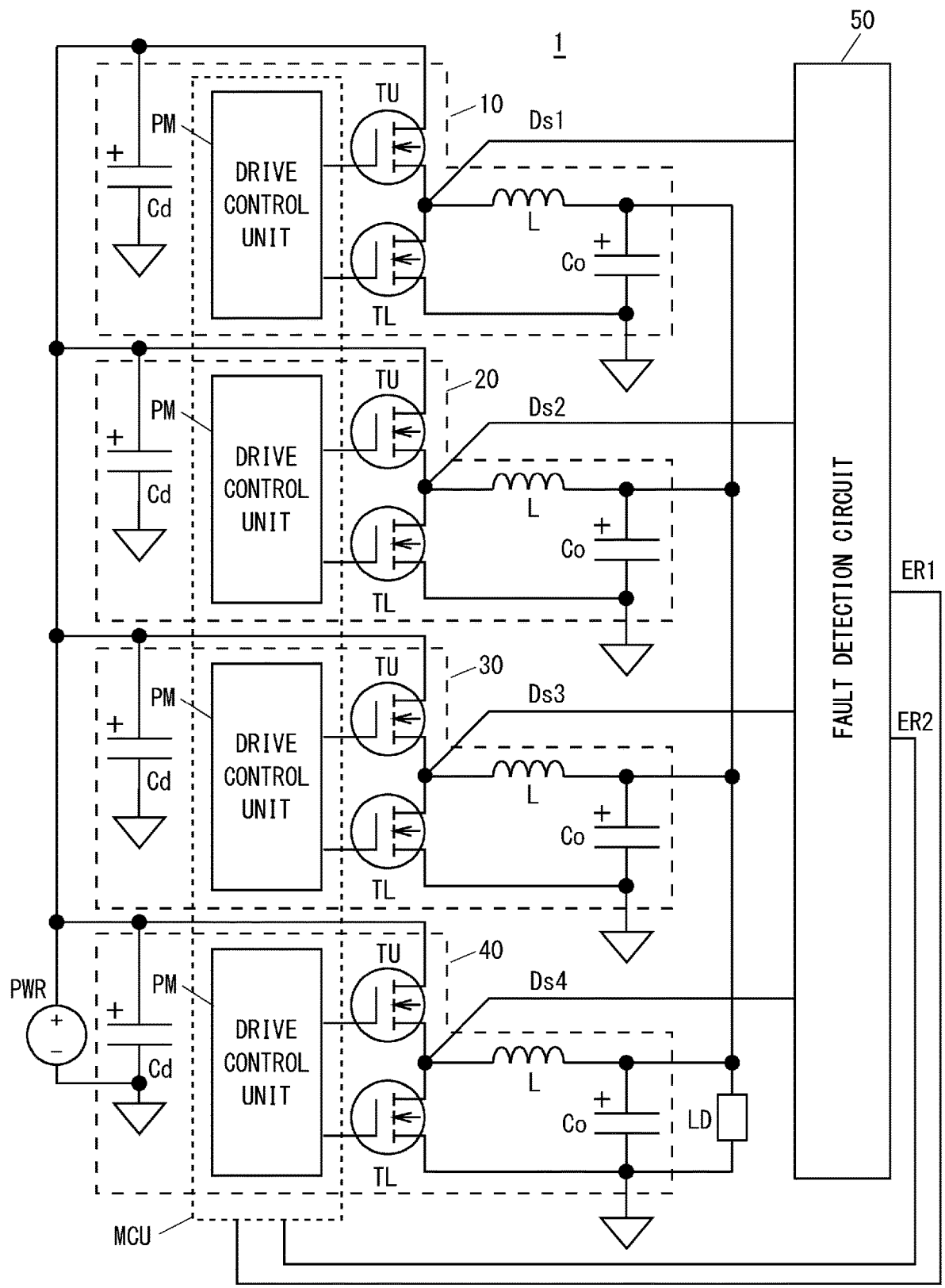
FIG. 1 is a block diagram of a multi-phase power supply according to a first embodiment.

FIG. 1 is a block diagram of a multi-phase power supply 1 according to a first embodiment. The multi-phase power supply 1 shown in FIG. 1 supplies power to a load circuit LD with drive signals having four phases which differ by 90 degrees. A multi-phase power supply circuit may be any circuit that supplies power to the load circuit LD with drive signals of two or more different phases, and a capacity to supply load current to the load circuit LD increases as the number of phases of the drive signals increases. A fault detection circuit 50 described below can be applied to a multi-phase power supply that supplies power to the load circuit LD using drive signals of two or more phases.

As shown in FIG. 1, the multi-phase power supply 1 includes a power supply main body and the fault detection circuit 50. The power supply main body changes an operation mode when the fault detection circuit 50 is notified of an occurrence of an abnormality using abnormality detection signals ER1 and ER2. As the operation mode, there may be various operations such as a safe mode in which the operation is continued while reducing the number of drive phases, a stop mode in which the operation is stopped, and so on.

In the example shown in FIG. 1, the power supply main body has switching power supplies 10 to 40, a power supply PWR, and the load circuit LD. The power supply PWR is a source of power supply current given to the load circuit LD, and the power supplies of the other circuits are not shown in FIG. 1. The power supply PWR may be provided separately from the multi-phase power supply apparatus 1, and the load circuit LD is a circuit to which the power is supplied by the multi-phase power supply apparatus 1. The load circuit LD is shown in FIG. 1 to clarify the configuration of the multi-phase power supply apparatus 1.

In the example shown in FIG. 1, the switching power supply 10 corresponds to a drive signal with a phase of 0 degrees, the switching power supply 20 corresponds to a drive signal with a phase of 90 degrees, the switching power supply 30 corresponds to a drive signal with a phase of 180 degrees, and the switching power supply 40 corresponds to a drive signal with a phase of 270 degrees.

The switching power supplies 10 to 40 have the same configuration. Each of them has a drive control unit PM, a decoupling capacitor Cd, power transistors TU and TL, an inductor L, and an output capacitor Co.

The decoupling capacitor Cd is connected between power supply wiring connected to a positive electrode side of the power supply PWR and ground wiring. The power transistors TU and TL are connected in series between the power supply wiring and the ground wiring. In the example shown in FIG. 1, both the power transistors TU and TL are NMOS transistors, but the NMOS and PMOS transistors can also be combined. One end of the inductor L is connected to a connection point between the power transistors TU and TL, and the other end thereof is connected to the load circuit LD. The output capacitor Co is connected between the other end of the inductor L and the ground wiring. The drive control unit PM is, for example, a PWM signal generation circuit that generates a PWM (Pulse Width Modulation) signal, and the PWM signal causes the power transistors TU and TL to perform a push-pull operation. In the example shown in FIG. 1, the drive control unit PM included in the switching power supplies 10 to 40 is implemented by a plurality of PWM modules included in one drive processor MCU. It is assumed that the drive processor MCU includes an operation unit (not shown). By the operation unit executing a power supply control program, the drive processor MCU can change the frequency of the drive signals in the multi-phase power supply apparatus 1, change the number of drive phases, and change the operation mode such as starting and stopping.

Each of the switching power supplies 10 to 40 uses the connection point between the power transistors TU and TL as an output terminal to generate a square-wave drive signal for the output terminal. Further, each of the switching power supplies 10 to 40 uses the inductor L connected to the output terminal and the output capacitor Co connected to the other end of the inductor L to smooth the drive signals to generate the power supply to be given to the load circuit LD. In the example shown in FIG. 1, the drive signals output from the output terminals of the switching power supplies 10 to 40 are referred to as drive signals Ds1 to Ds4, respectively. The drive signals are not limited to square waves and may be sinusoidal, but power efficiency can be enhanced by using the drive signals of square waves.

In the multi-phase power supply apparatus 1, the drive signals Ds1 to Ds4 are monitored by the fault detection circuit 50. When a fault is detected in the switching power supplies 10 to 40 based on a magnitude of a phase difference between the plurality of drive signals, the drive processor MPU is notified of an error by the abnormality detection signals ER1 and ER2. When the drive processor MPU recognizes the occurrence of the error in this way, for example, the operation of the multi-phase power supply 1 is stopped. When an error occurs, in addition to stopping the operation of the multi-phase power supply apparatus 1, for example, it is possible to stop the switching power supply in which a fault has occurred and cause the switching power supply to transition to the safe mode in which the number of drive phases is reduced.

Figure 2:
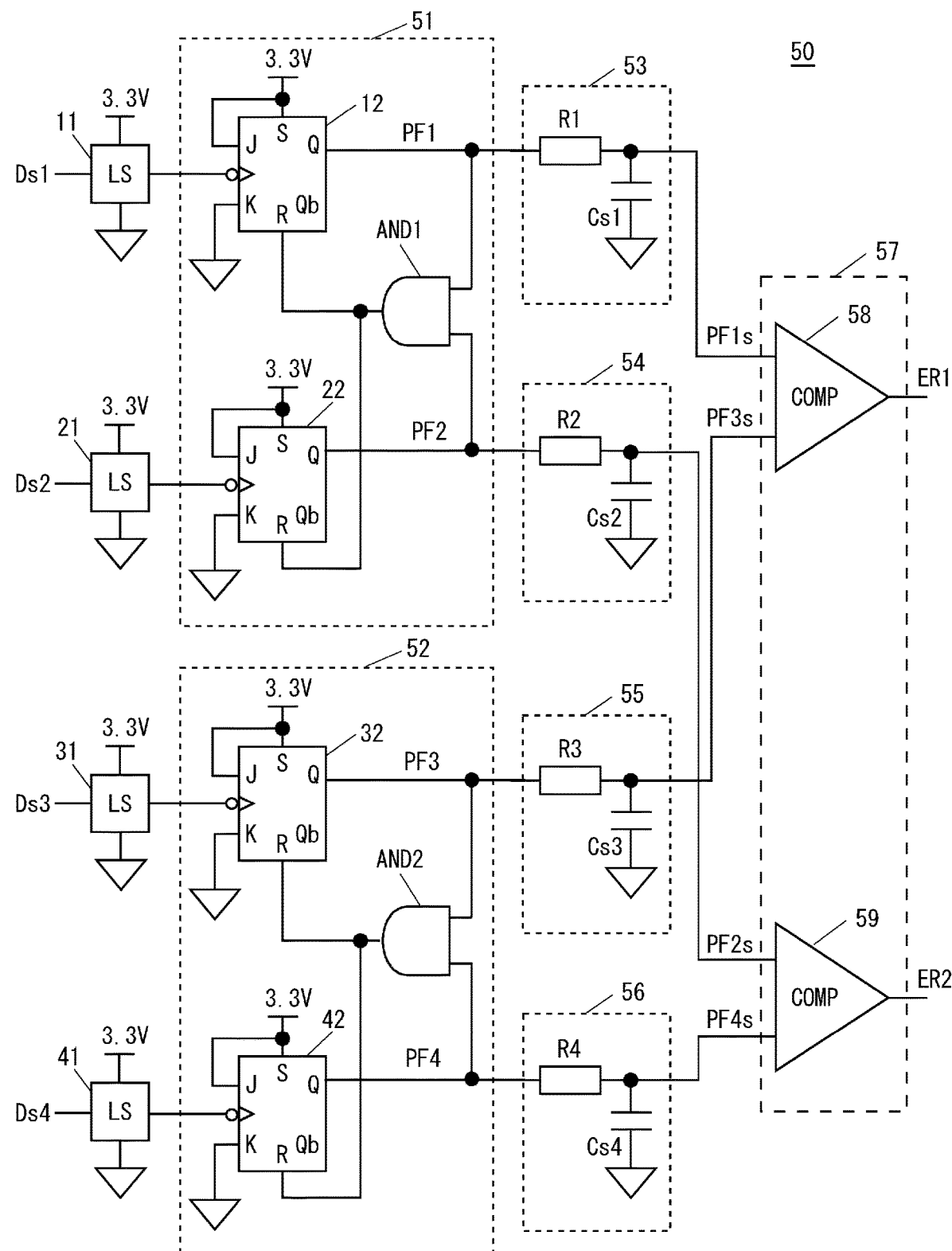
FIG. 2 is a block diagram of a fault detection circuit according to the first embodiment.

Next, the fault detection circuit 50 will be described in detail. The fault detection circuit 50 detects an abnormality in the switching power supplies 10 to 40 based on a shift in the phase difference between the plurality of drive signals output by the plurality of drive circuits from a predetermined specified state. FIG. 2 is a block diagram of the fault detection circuit 50 according to the first embodiment.

As shown in FIG. 2, the fault detection circuit 50 according to the first embodiment has phase difference detection circuits 51 and 52, smoothing circuits 53 to 56, and an error detection circuit 57. The fault detection circuit 50 also has level shift circuits 11, 21, 31, and 41.

The level shift circuit 11 suppresses an amplitude of the drive signal Ds1 output from the switching power supply 10 to a power supply voltage (e.g., 3.3 V) or less of the subsequent circuit, and gives the drive signal with the suppressed amplitude to the phase difference detection circuit 51. The level shift circuit 21 suppresses an amplitude of the drive signal Ds2 output from the switching power supply 20 to the power supply voltage (e.g., 3.3 V) or less of the subsequent circuit, and gives the drive signal with the suppressed amplitude to the phase difference detection circuit 51. The level shift circuit 31 suppresses an amplitude of the drive signal Ds3 output from the switching power supply 30 to the power supply voltage (e.g., 3.3 V) or less of the subsequent circuit, and gives the drive signal with the suppressed amplitude to the phase difference detection circuit 52. The level shift circuit 41 suppresses an amplitude of the drive signal Ds4 output from the switching power supply 40 to the power supply voltage (e.g., 3.3 V) or less of the subsequent circuit, and gives the drive signal with the suppressed amplitude to the phase difference detection circuit 52. When the drive signal is generated based on a driving power supply voltage higher than, for example, 12 V, the level shift circuit suppresses the amplitude of the drive signal to a voltage lower than the driving power supply voltage, so that the fault detection circuit 50 can be composed of a circuit with low power consumption and reduced circuit area using a low-breakdown voltage element.

In FIG. 2, as the plurality of phase detection circuits, a first phase difference detection circuit (e.g., phase difference detection circuit 51) and a second phase difference detection circuit (e.g., phase difference detection circuit 52) are shown. The phase difference detection circuit 51 outputs a first phase difference measurement signal (e.g., phase difference detection signal PF1 and phase difference detection signal PF2) having a pulse width corresponding to a magnitude of a phase difference between two drive signals (e.g., drive signal Ds1 and drive signal Ds2) of adjacent phases among the plurality of drive signals. The phase difference detection circuit 52 also outputs a second phase difference measurement signal (e.g., phase difference detection signal PF3 and phase difference detection signal PF4) having a pulse width corresponding to a magnitude of a phase difference between two drive signals (e.g., drive signal Ds3 and drive signal Ds4) of adjacent phases and whose phase is delayed behind that of the drive signal, which the phases are to be compared by the phase difference detection circuit 51.

Here, the phase difference detection signals PF1 to PF4 each contain information about the phase difference as follows. The phase difference detection signal PF1 is a first phase difference detection signal, and indicates an amount of phase advance of the second drive signal from that of the first drive signal for the first drive signal (e.g., drive signal Ds1) and the second drive signal (e.g., drive signal Ds2) whose phase is delayed behind that of the first drive signal. The phase difference detection signal PF2 is a second phase difference detection signal, and indicates an amount of phase delay of the second drive signal behind that of the first drive signal.

The phase difference detection signal PF3 is a third phase difference detection signal that indicates, for a third drive signal (e.g., drive signal Ds3) whose phase is delayed behind that of the second drive signal and a fourth drive signal (e.g., drive signal Ds4) whose phase is delayed behind that of the third drive signal from among the plurality of drive signals, an amount of phase advance of the fourth drive signal from that of the third drive signal. The phase difference detection signal PF4 is a fourth phase difference detection signal and indicates an amount of phase delay of the fourth drive signal behind that of the third drive signal.

Furthermore, the phase difference detection circuit 51 outputs a phase difference determination signal PF1 and a phase difference determination signal PF2 based on the magnitude of the phase difference between falling timings of the first and second drive signals. The phase difference detection circuit 52 outputs a phase difference determination signal PF3 and a phase difference determination signal PF4 based on the magnitude of the phase difference between falling timings of the third and fourth drive signals.

Specific circuits of the phase difference detection circuits 51 and 52 shown in FIG. 2 will be described. The phase difference detection circuits 51 and 52 shown in FIG. 2 have the same circuit configuration and the corresponding input and output signals are different. The phase difference detection circuit 51 has the JK flip-flops 12 and 22 and an AND gate AND1. Each of the JK flip-flops 12 and 22 has input terminals J and K, a clock input terminal, a set terminal S, a reset terminal R, and output terminals Q and Qb. A power supply voltage is given to the input terminal J and the set terminal S of the JK flip-flop 12. A ground voltage is given to the input terminal K of the JK flip-flop 12. The drive signal Ds1 whose amplitude is suppressed by the level shift circuit 11 is input to the clock input terminal of the JK flip-flop 12. The phase difference detection signal PF1 is output to the output terminal Q of the JK flip-flop 12. The output terminal Qb of the JK flip-flop 12 is in an open state.

A power supply voltage is given to the input terminal J and the set terminal S of the JK flip-flop 22. A ground voltage is given to the input terminal K of the JK flip-flop 22. The drive signal Ds2 whose amplitude is suppressed by the level shift circuit 21 is input to the clock input terminal of the JK flip-flop 22. The phase difference detection signal PF2 is output to the output terminal Q of the JK flip-flop 22. The output terminal Qb of the JK flip-flop 22 is in an open state. Next, the phase difference detection signals PF1 and PF2 are input to the AND gate AND1, and a logical sum of the phase difference detection signals PF1 and PF2 is output. An output signal of the AND gate AND1 is input to the reset terminal R of the JK flip-flops 12 and 22.

The phase difference detection circuit 52 has JK flip-flops 32 and 42 and an AND gate AND2. Each of the JK flip-flops 32 and 42 has input terminals J and K, a clock input terminal, a set terminal S, a reset terminal R, and output terminals Q and Qb. A power supply voltage is given to the input terminal J and the set terminal S of the JK flip-flop 32. A ground voltage is given to the input terminal K of the JK flip-flop 32. The drive signal Ds3 whose amplitude is suppressed by the level shift circuit 31 is input to the clock input terminal of the JK flip-flop 32. The phase difference detection signal PF3 is output to the output terminal Q of the JK flip-flop 32. The output terminal Qb of the JK flip-flop 32 is in an open state.

A power supply voltage is given to the input terminal J and the set terminal S of the JK flip-flop 42. A ground voltage is given to the input terminal K of the JK flip-flop 42. The drive signal Ds4 whose amplitude is suppressed by the level shift circuit 41 is input to the clock input terminal of the JK flip-flop 42. The phase difference detection signal PF4 is output to the output terminal Q of the JK flip-flop 42. The output terminal Qb of the JK flip-flop 42 is in an open state. The phase difference detection signals PF3 and PF4 are input to the AND gate AND2, and a logical sum of the phase difference detection signals PF3 and PF4 is output. An output signal of the AND gate AND2 is input to the reset terminals R of the JK flip-flops 32 and 42.

Here, the JK flip-flop means that a value of a signal output from output terminal Q changes according to a falling edge of a signal input to the clock input terminal by a value given to the input terminals J and K. Specifically, if a falling edge is input to the clock input terminal when 0 (e.g., ground voltage) is input to both the input terminals J and K, the JK flip-flop maintains the value of the output terminal Q. If a falling edge is input to the clock input terminal when 1 (e.g., power supply voltage) is input to both the input terminals J and K, the JK flip-flop inverts the value of the output terminal Q. If a falling edge is input to the clock input terminal when 0 is input to the input terminal J and 1 is input to the input terminal K, the JK flip-flop sets the value of the output terminal Q to 0. If a falling edge is input to the clock input terminal when 1 is input to the input terminal J and 0 is input to the input terminal K, the JK flip-flop sets the value of the output terminal Q to 1.

The phase difference detection circuits 51 and 52 using the JK flip-flops 12, 22, 32, and 42, which circuits perform the above operations, cause the phase difference detection signals PF1 and PF3 to transition from a low level to a high level in response to the falling of the drive signal whose phase is advanced, and switches the phase difference detection signals PF1 and PF3 from a high level to a low level and maintains them at a low level in response to the falling of the drive signal whose phase is advanced. Here, the phase difference detection circuits 51 and 52 raise the phase difference detection signals PF2 and PF4 in response to the falling of the drive signal whose phase is advanced, but the moment the phase difference detection signals PF2 and PF4 rise, the AND gate sets the reset terminal R of the JK flip-flops 12, 22, 32, and 42 to a high level, so that the JK flip-flops 12, 22, 32, and 42 are reset, and the phase difference detection signals PF1 to PF4 become a high level from a low level. As a result, the phase difference detection signals PF2 and PF4 become a high level in a spiky waveform, but become a waveform that substantially maintains the low level.

Each of the smoothing circuits 53 to 56 smooths the phase difference measurement signal associated with it in advance and outputs a phase difference detection voltage having a voltage value corresponding to the magnitude of the phase difference. Each of the smoothing circuits 53 to 56 has the same circuit configuration and has a resistor arranged on a signal transmission line and a capacitor provided between the wiring on the signal output end side of the resistor and the ground wiring. Next, each of the smoothing circuits 53 to 56 outputs a phase difference detection voltage whose direct-current voltage is determined according to a duty ratio of the phase difference detection signal from a signal output end.

Specifically, the smoothing circuit 53 has a resistor R1 to which the phase difference detection signal PF1 is input to one end thereof and the other end is a signal output end, and a capacitor Cs1 connected between the signal output end of the resistor R1 and the ground wiring. The signal output by the smoothing circuit 53 is a phase difference detection voltage PF1s.

The smoothing circuit 54 has a resistor R2 to which the phase difference detection signal PF2 is input to one end thereof and the other hand is a signal output end, and a capacitor Cs2 connected between the signal output end of the resistor R2 and the ground wiring. The signal output by the smoothing circuit 54 is a phase difference detection voltage PF2s.

The smoothing circuit 55 has a resistor R3 to which a phase difference detection signal PF3 is input to one end thereof and the other hand is a signal output end, and a capacitor Cs3 connected between the signal output end of the resistor R3 and the ground wiring. The signal output by the smoothing circuit 55 is a phase difference detection voltage PF3s.

The smoothing circuit 56 has a resistor R4 to which a phase difference detection signal PF4 is input to one end thereof and the other hand is a signal output end, and a capacitor Cs4 connected between the signal output end of the resistor R4 and the ground wiring. The signal output by the smoothing circuit 56 is a phase difference detection voltage PF4s.

The error detection circuit 57 compares the plurality of phase difference detection voltages and switches the abnormality detection signal (e.g., abnormal detection signals ER1 and ER2) from a disabled state to an enabled state when there is a phase difference detection voltage with a voltage value exceeding a preset tolerance range. Here, in the error detection circuit 57, as the preset tolerance range, the different plurality of phase difference detection voltages generated from the phase difference detection signals having the same duty ratio in a normal operation in which no fault is occurring in the switching power supplies 10 to 40 are compared with each other, and a range in which the voltage of the compared signals cannot be regarded as identical on the circuit is used.

Specifically, the error detection circuit 57 has comparison circuits 58 and 59. The comparison circuit 58 compares the phase difference detection voltage PF1s with the phase difference detection voltage PF2s generated from the phase difference detection signal PF1 and the phase difference detection signal PF2, respectively, which have the same duty ratio when the switching power supplies 10 to 40 operate normally and then switches a signal level of the abnormality detection signal ER1. The comparison circuit 59 compares the phase difference detection voltage PF2s with the phase difference detection voltage PF4s generated from the phase difference detection signal PF2 and the phase difference detection signal PF4, respectively, which have the same duty ratio when the switching power supplies 10 to 40 operate normally and then switches a signal level of the abnormality detection signal ER2. The comparison circuits 58 and 59 enable (i.e., set it to a high level) the abnormality detection signal that is output when the voltage difference between two input voltages falls outside the range that can be regarded as identical on the circuit, and disable (i.e., set it to a low level) the abnormality detection signal when the voltage difference between the two voltages falls within the range that can be regarded as identical on the circuit.

From the above description, the error detection circuit 57 compares the phase difference detection voltage PF1s, which is obtained by the smoothing circuit 53 smoothing the phase difference determination signal PF1, and the phase difference detection voltage PF3s, which is obtained by the smoothing circuit 55 smoothing the phase difference determination signal PF3, and switches the first abnormality detection signal (e.g., abnormality detection signal ER1) included in the abnormality detection signal from a disabled state to an enabled state in response to an occurrence of a voltage difference between the two phase difference detection voltages. Further, the error detection circuit 57 compares the phase difference detection voltage PF2s, which is obtained by the smoothing circuit 54 smoothing the phase difference determination signal PF2, and the phase difference detection voltage PF4s, which is obtained by the smoothing circuit 56 smoothing the phase difference determination signal PF4, and switches the second abnormality detection signal (e.g., abnormality detection signal ER2) included in the abnormality detection signal from a disabled state to an enabled state in response to an occurrence of a voltage difference between the two phase difference detection voltages.

Next, the operation of the fault detection circuit 50 according to the first embodiment is described. In the following description, the operation of the fault detection circuit 50 is described with reference to a timing chart of a period during which the drive signals for two periods are output. In addition, it is assumed that the drive signals Ds1 to Ds4 have a duty ratio of 50% and a phase shift of 90 degrees in the normal state. In the timing chart described below, examples are shown in which the drive signal Ds1 with a basic phase (e.g., 0 degrees) rises at timings T1 and T5, the drive signal Ds2 with a phase delay of 90 degrees from the basic phase rises at timings T2 and T6, the drive signal Ds3 with a phase delay of 180 degrees from the basic phase rises at timings T3 and T7, and the drive signal Ds4 with a phase delay of 270 degrees from the basic phase rises at timings T4 and T8.

Figure 3:
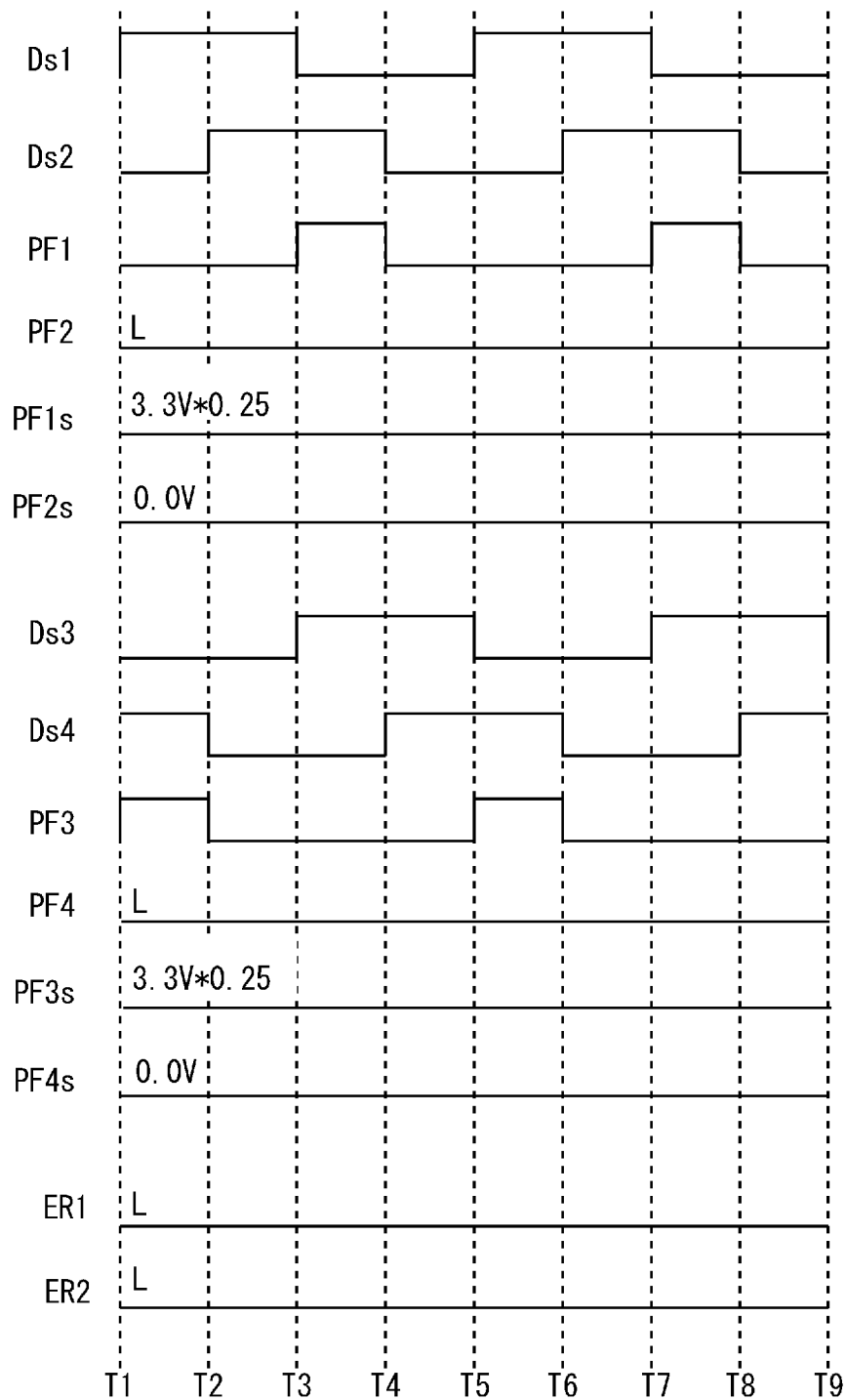
FIG. 3 is a timing chart describing a first operation example of the fault detection circuit according to the first embodiment.

First, FIG. 3 is a timing chart for describing a first operation example of the fault detection circuit according to the first embodiment. The first operation example is an operation of the fault detection circuit 50 when all the switching power supplies 10 to 40 are operating normally.

As shown in FIG. 3, when all the switching power supplies 10 to 40 are operating normally, in the fault detection circuit 50, the JK flip-flop 12 raises the phase difference detection signal PF1 in response to the falling of the drive signal Ds1. In the fault detection circuit 50, the JK flip-flop 22 raises the phase difference detection signal PF2 in response to the falling of the drive signal Ds2. When both the phase difference detection signal PF1 and the phase difference detection signal PF2 become a high level, the signal given by the AND gate AND1 to the reset terminals R of the JK flip-flops 12 and 22 is switched from a low level to a high level, so that the phase difference detection signal PF1 is switched from a high level to a low level in response to the rising of the phase difference detection signal PF2. Moreover, since the high-level phase difference detection signal PF2 is input to the reset terminal R of the JK flip-flop 22 right after the rise, the waveform quickly becomes a low level and substantially maintains the low level.

With such an operation, the phase difference detection signal PF1 becomes a signal with a duty ratio of 25%, and the phase difference detection signal PF2 becomes a signal with a duty ratio of 0% while maintaining the low level. In the fault detection circuit 50, the phase difference detection signals PF1 and PF2 are smoothed by the smoothing circuits 53 and 54 to generate the phase difference detection voltages PF1s and PF2s having voltage values obtained by multiplying the power supply voltage by the duty ratio. In the example shown in FIG. 3, the phase difference detection voltage PF1s becomes 3.3 V×0.25, and the phase difference detection voltage PF2s maintains 0.0 V.

In the fault detection circuit 50, the JK flip-flop 32 raises the phase difference detection signal PF3 in response to the falling of the drive signal Ds3. In the fault detection circuit 50, the JK flip-flop 42 raises the phase difference detection signal PF4 in response to the falling of the drive signal Ds4. When both the phase difference detection signal PF3 and the phase difference detection signal PF4 become a high level, the signal given by the AND gate AND2 to the reset terminals R of the JK flip-flops 32 and 42 is switched from a low level to a high level, so that the phase difference detection signal PF3 is switched from a high level to a low level in response to the rising of the phase difference detection signal PF4. Moreover, since the high level phase difference detection signal PF4 is input to the reset terminal R of the JK flip-flop 42 right after the rise, the waveform quickly becomes a low level and substantially maintains the low level.

With such an operation, the phase difference detection signal PF3 becomes a signal with a duty ratio of 25%, and the phase difference detection signal PF4 becomes a signal with a duty ratio of 0% while maintaining the low level. In the fault detection circuit 50, the phase difference detection signals PF3 and PF4 are smoothed by the smoothing circuits 55 and 56 to generate the phase difference detection voltages PF3s and PF4s having voltage values obtained by multiplying the power supply voltage by the duty ratio. In the example shown in FIG. 3, the phase difference detection voltage PF3s becomes 3.3 V×0.25, and the phase difference detection voltage PF4s maintains 0.0 V.

In the fault detection circuit 50, since the phase difference detection voltages PF1s and PF3s input to the comparison circuit 58 of the error detection circuit 57 are the same voltage, the abnormality detection signal ER1 becomes a low level. In addition, since the phase difference detection voltages PF2s and PF4s input to the comparison circuit 59 are the same voltage, the abnormality detection signal ER2 becomes a low level. In this way, the fault detection circuit 50 sets both the abnormality detection signals ER1 and ER2 to a low level if no fault is occurring in the switching power supplies 10 to 40.

Next, since the fault detection circuit 50 can detect faults for a plurality of fault modes, in the following description, an operation is described using a timing chart for each fault mode that the fault detection circuit 50 can handle.

Figure 4:
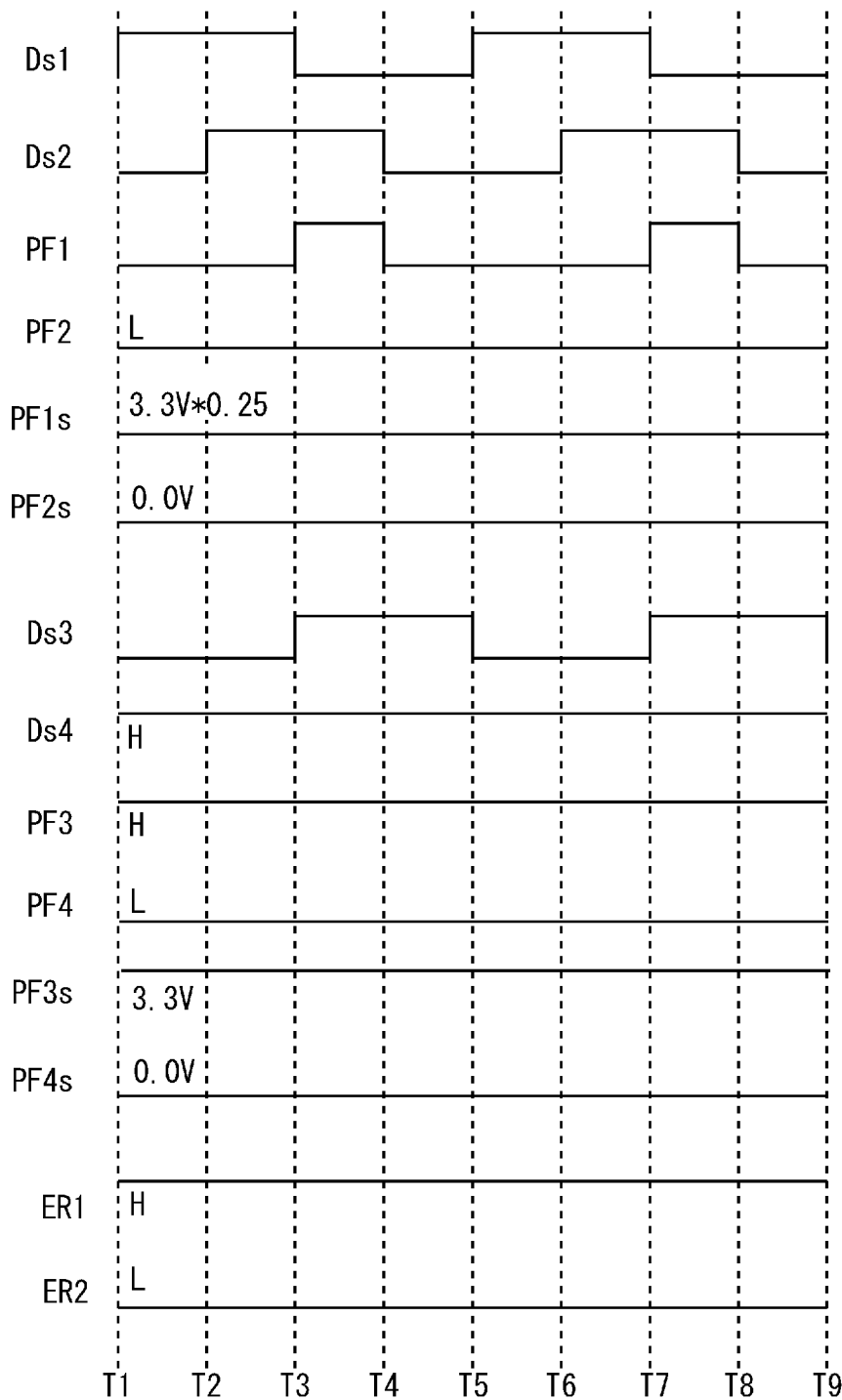
FIG. 4 is a timing chart describing a second operation example of the fault detection circuit according to the first embodiment.

First, FIG. 4 is a timing chart for describing a second operation example of the fault detection circuit according to the first embodiment. The second operation example is an example in which a power fault occurs. A power fault is a fault in which the output terminal outputting the drive signal Ds4 sticks to the power supply source side.

As shown in FIG. 4, in this case, the operation of the phase difference detection circuit 51 and the smoothing circuits 53 and 54, which generate the phase difference detection voltages PF1s and PF2 for comparing the phase differences between the drive signals Ds1 and Ds2, is the same as that shown in the timing chart shown in FIG. 3, so the description thereof is omitted here.

On the other hand, when a power fault occurs in the output terminal of the drive signal Ds4, the drive signal Ds4 maintains a high level. Therefore, when the rising edge of the drive signal Ds3 is input at a timing not shown in the drawing (e.g., a timing when a fault occurs), the JK flip-flop 32 sets the phase difference detection signal PF3 to a high level, after which its logic value level is maintained. This is because the falling edge does not occur in the drive signal Ds4, so that the JK flip-flops 32 and 42 are not reset.

With such an operation, the phase difference detection signal PF3 becomes a signal that maintains a high level with a duty ratio of 100%, and the phase difference detection signal PF4 becomes a signal with a duty ratio of 0% while maintaining the low level. In the fault detection circuit 50, the phase difference detection signals PF3 and PF4 are smoothed by the smoothing circuits 55 and 56 to generate the phase difference detection voltages PF3s and PF4s having voltage values obtained by multiplying the power supply voltage by the duty ratio. In the example shown in FIG. 4, the phase difference detection voltage PF3s becomes 3.3 V, and the phase difference detection voltage PF4s maintains 0.0 V.

Next, the fault detection circuit 50 sets the abnormality detection signal ER1 to a high level, because the phase difference detection voltages PF1s and PF3s input to the comparison circuit 58 of the error detection circuit 57 are shifted. Moreover, the abnormality detection signal ER2 becomes a low level, because the phase difference detection voltages PF2s and PF4s input to the comparison circuit 59 are the same voltage. Thus, when a fault occurs in the switching power supply 40, the fault detection circuit 50 sets the abnormality detection signal ER1 to a high level and the abnormality detection signal ER2 to a low level.

Figure 5:
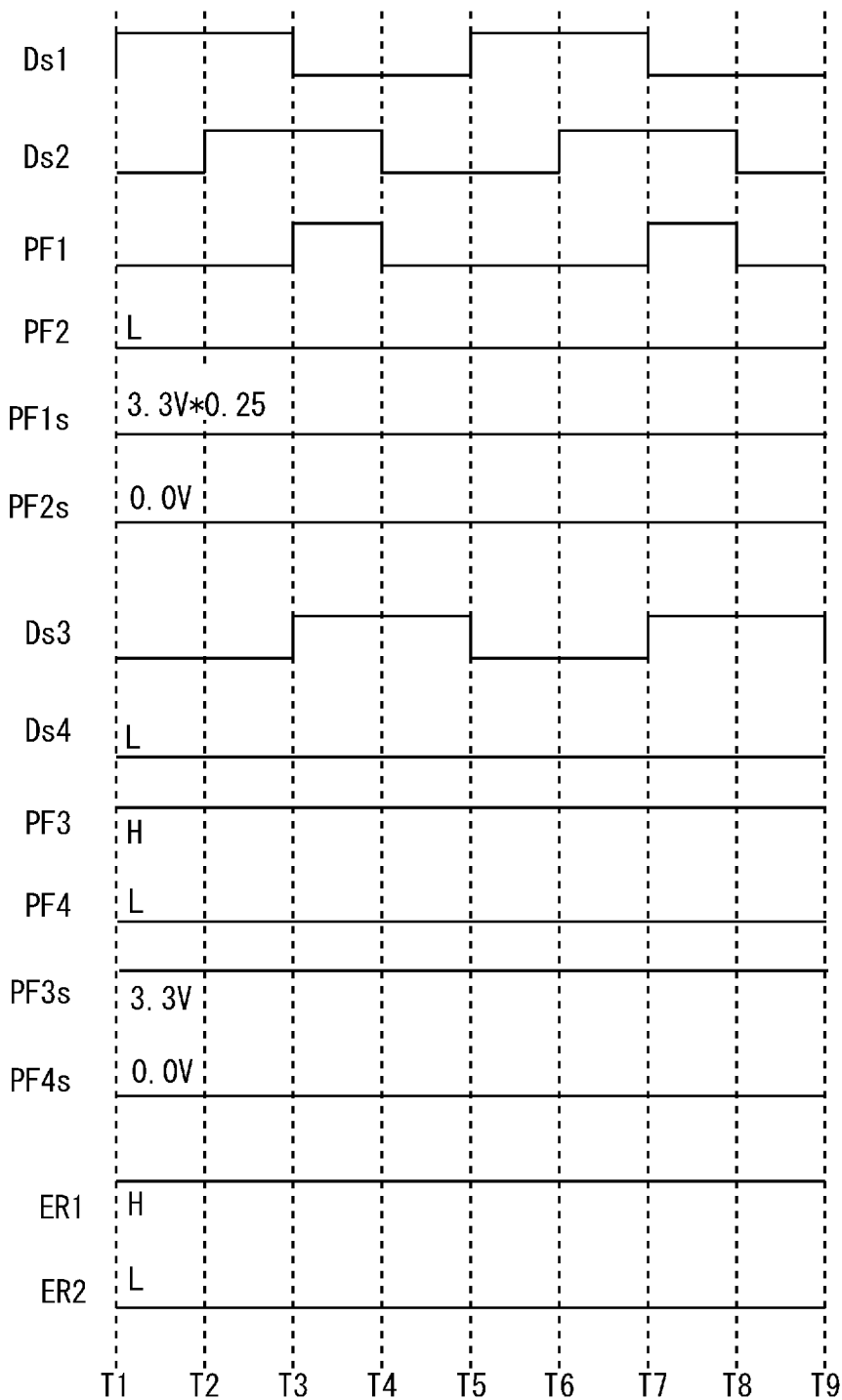
FIG. 5 is a timing chart describing a third operation example of the fault detection circuit according to the first embodiment.

Next, FIG. 5 is a timing chart for describing a third operation example of the fault detection circuit according to the first embodiment. The third operation example is an example in which an earth fault occurs. An earth fault is a fault in which the output terminal outputting the drive signal Ds4 sticks to the ground voltage supply side.

As shown in FIG. 5, in this case, the operation of the phase difference detection circuit 51 and the smoothing circuits 53 and 54, which generate the phase difference detection voltages PF1s and PF2 for comparing the phase differences between the drive signals Ds1 and Ds2, is the same as that shown in the timing chart shown in FIG. 3, so the description thereof is omitted here.

On the other hand, when an earth fault occurs in the output terminal of the drive signal Ds4, the drive signal Ds4 maintains a low level. Therefore, when the rising edge of the drive signal Ds3 is input at a timing not shown in the drawing (e.g., a timing when a fault occurs), the JK flip-flop 32 sets the phase difference detection signal PF3 to a high level, after which its logic value level is maintained. This is because the falling edge does not occur in the drive signal Ds4, so that the JK flip-flops 32 and 42 are not reset.

With such an operation, the phase difference detection signal PF3 becomes a signal that maintains a high level with a duty ratio of 100%, and the phase difference detection signal PF4 becomes a signal with a duty ratio of 0% while maintaining the low level. In the fault detection circuit 50, the phase difference detection signals PF3 and PF4 are smoothed by the smoothing circuits 55 and 56 to generate the phase difference detection voltages PF3s and PF4s having voltage values obtained by multiplying the power supply voltage by the duty ratio. In the example shown in FIG. 5, the phase difference detection voltage PF3s becomes 3.3 V, and the phase difference detection voltage PF4s maintains 0.0 V.

Next, the fault detection circuit 50 sets the abnormality detection signal ER1 to a high level, because the phase difference detection voltages PF1s and PF3s input to the comparison circuit 58 of the error detection circuit 57 are shifted. Moreover, the abnormality detection signal ER2 becomes a low level, because the phase difference detection voltages PF2s and PF4s input to the comparison circuit 59 are the same voltage. Thus, when a fault occurs in the switching power supply 40, the fault detection circuit 50 sets the abnormality detection signal ER1 to a high level and the abnormality detection signal ER2 to a low level.

Figure 6:
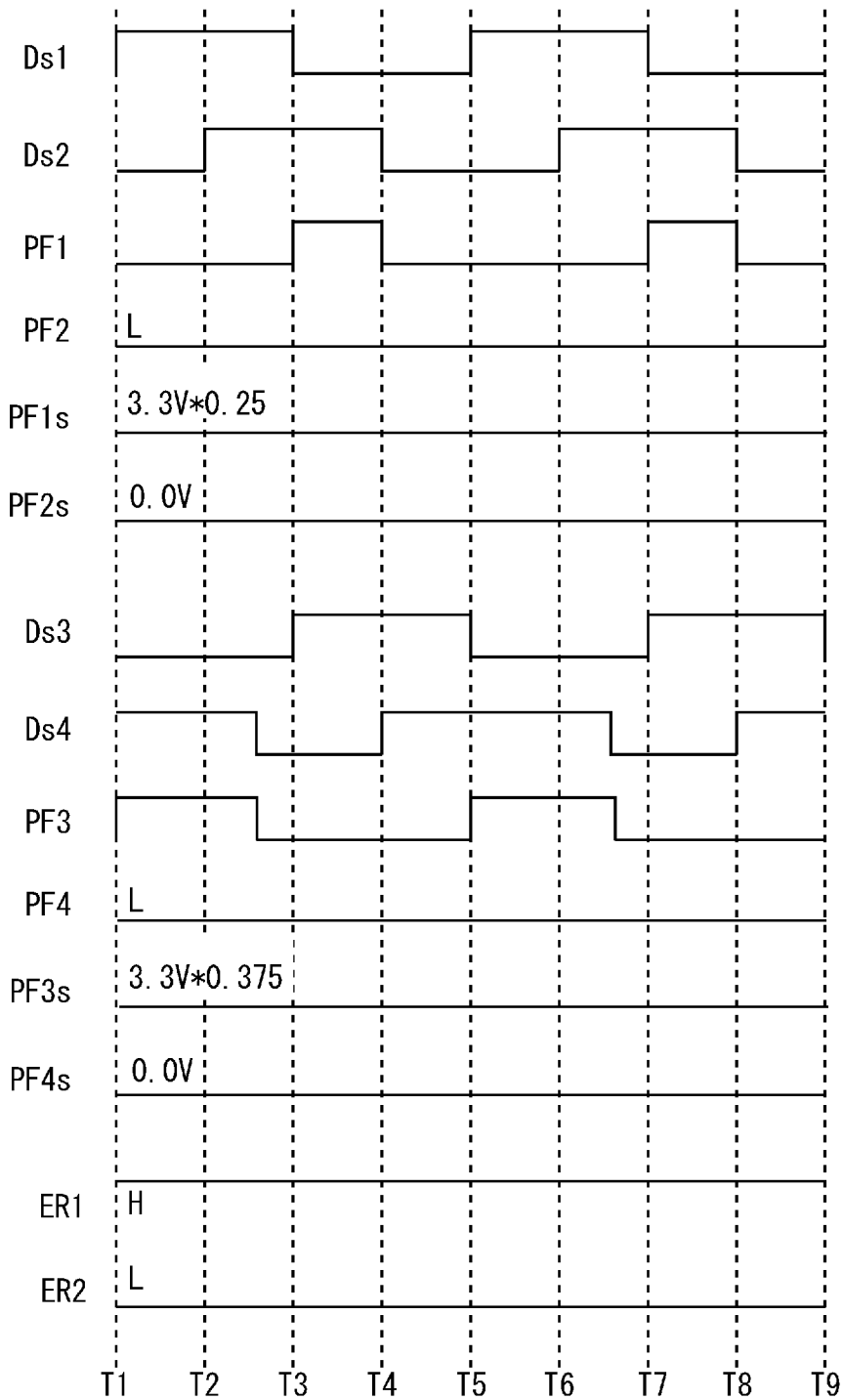
FIG. 6 is a timing chart describing a fourth operation example of the fault detection circuit according to the first embodiment.

Next, FIG. 6 is a timing chart describing a fourth operation example of the fault detection circuit according to the first embodiment. The fourth operation example is an example in which an output voltage abnormality occurs. An output voltage abnormality is an abnormality in which the duty ratio of the drive signal Ds4 becomes larger than those of other drive signals.

As shown in FIG. 6, in this case, the operation of the phase difference detection circuit 51 and the smoothing circuits 53 and 54, which generate the phase difference detection voltages PF1s and PF2 for comparing the phase differences between the drive signals Ds1 and Ds2, is the same as that in the timing chart shown in FIG. 3, so the description thereof is omitted here.

On the other hand, in the example shown in FIG. 6, a duty abnormality occurs such that the falling timing of the drive signal Ds4 is delayed behind that when the normal operation is performed. As a result, in the fault detection circuit 50, a delay occurs in the timing at which the JK flip-flops 32 and 42 are reset, and the period during which the phase difference detection signal PF3 is at a high level becomes long. That is, in the example shown in FIG. 6, the duty ratio of the phase difference detection signal PF3 becomes larger than those of other drive signals. In the example shown in FIG. 6, the phase difference detection signal PF3 has a duty ratio of 37.5%. Also in the example shown in FIG. 6, the phase difference detection signal PF4 maintains a low level, and the signal has a duty ratio of 0% as in the example shown in FIG. 3.

In the fault detection circuit 50, the phase difference detection signals PF3 and PF4 are smoothed by the smoothing circuits 55 and 56 to generate the phase difference detection voltages PF3s and PF4s having voltage values obtained by multiplying the power supply voltage by the duty ratio. In the example shown in FIG. 6, the phase difference detection voltage PF3s becomes 3.3 V×0.375, and the phase difference detection voltage PF4s maintains 0.0 V.

Next, the fault detection circuit 50 sets the abnormality detection signal ER1 to a high level, because the phase difference detection voltages PF1s and PF3s input to the comparison circuit 58 of the error detection circuit 57 are shifted. Moreover, the abnormality detection signal ER2 becomes a low level, because the phase difference detection voltages PF2s and PF4s input to the comparison circuit 59 are the same voltage. Thus, when an output voltage abnormality occurs in which only the drive signal Ds4 has a large duty ratio, the fault detection circuit 50 sets the abnormality detection signal ER1 to a high level and the abnormality detection signal ER2 to a low level.

Figure 7:
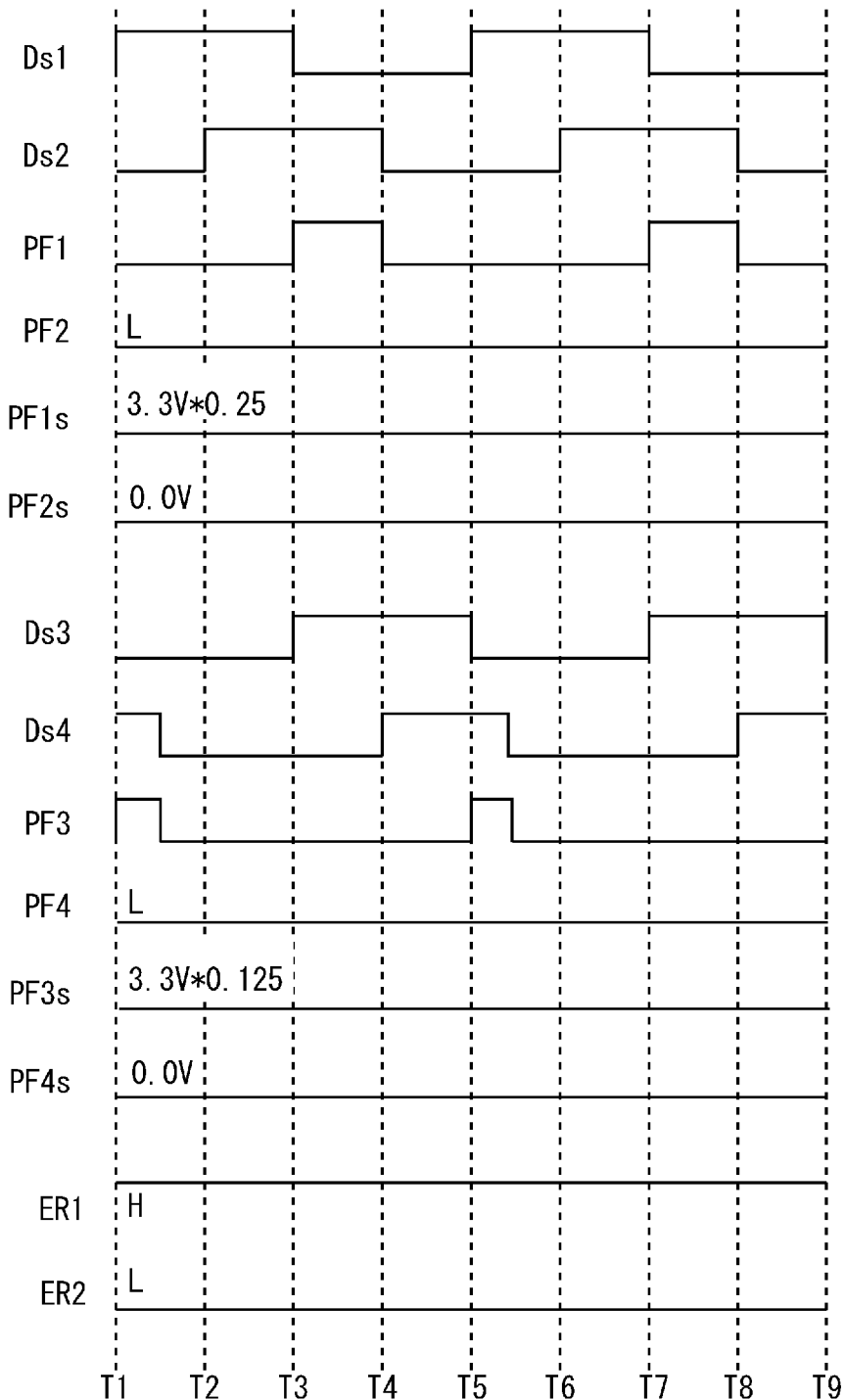
FIG. 7 is a timing chart describing a fifth operation example of the fault detection circuit according to the first embodiment.

Next, FIG. 7 is a timing chart describing a fifth operation example of the fault detection circuit according to the first embodiment. The fifth operation example is an example in which an output voltage abnormality occurs. An output voltage abnormality is an abnormality in which the duty ratio of the drive signal Ds4 becomes smaller than those of other drive signals.

As shown in FIG. 7, in this case, the operation of the phase difference detection circuit 51 and the smoothing circuits 53 and 54, which generate the phase difference detection voltages PF1s and PF2 for comparing the phase differences between the drive signals Ds1 and Ds2, is the same as that shown in the timing chart shown in FIG. 3, so the description thereof is omitted here.

On the other hand, in the example shown in FIG. 7, a duty abnormality occurs such that the falling timing of the drive signal Ds4 becomes earlier than that when the normal operation is performed. As a result, in the fault detection circuit 50, the timing at which the JK flip-flops 32 and 42 are reset becomes earlier, and the period during which the phase difference detection signal PF3 is at a high level becomes short. That is, in the example shown in FIG. 7, the duty ratio of the phase difference detection signal PF3 becomes smaller than those of other drive signals. In the example shown in FIG. 7, the phase difference detection signal PF3 has a duty ratio of 12.5%. Also in the example shown in FIG. 7, the phase difference detection signal PF4 maintains a low level and the signal has a duty ratio of 0% as in the example shown in FIG. 3.

In the fault detection circuit 50, the phase difference detection signals PF3 and PF4 are smoothed by the smoothing circuits 55 and 56 to generate the phase difference detection voltages PF3s and PF4s having voltage values obtained by multiplying the power supply voltage by the duty ratio. In the example shown in FIG. 6, the phase difference detection voltage PF3s becomes 3.3 V×0.125, and the phase difference detection voltage PF4s maintains 0.0 V.

Next, the fault detection circuit 50 sets the abnormality detection signal ER1 to a high level because the phase difference detection voltages PF1s and PF3s input to the comparison circuit 58 of the error detection circuit 57 are shifted. Moreover, the abnormality detection signal ER2 becomes a low level, because the phase difference detection voltages PF2s and PF4s input to the comparison circuit 59 are the same voltage. Thus, when an output voltage abnormality occurs in which only the drive signal Ds4 has a small duty ratio, the fault detection circuit 50 sets the abnormality detection signal ER1 to a high level and the abnormality detection signal ER2 to a low level.

Figure 8:
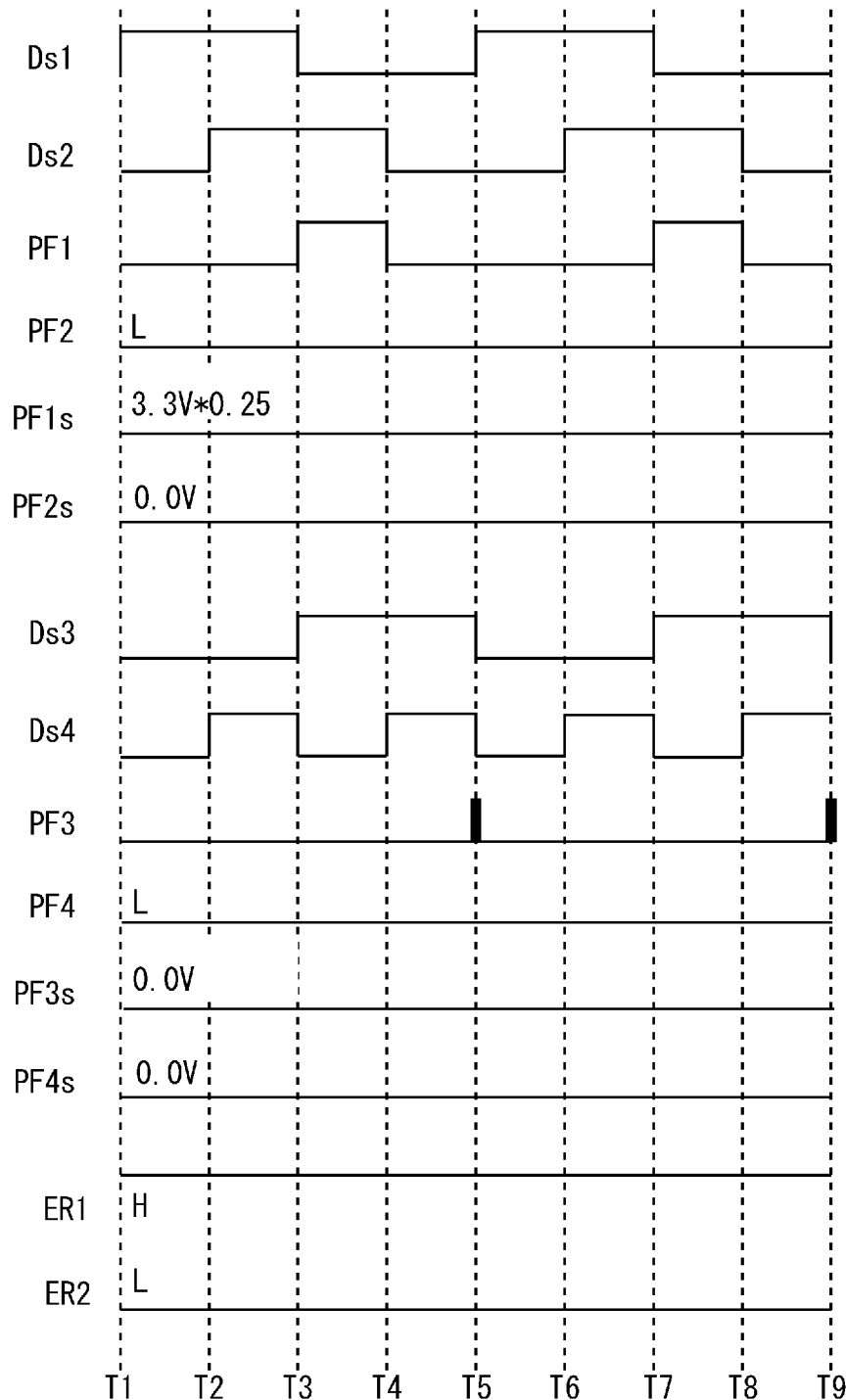
FIG. 8 is a timing chart describing a sixth operation example of the fault detection circuit according to the first embodiment.

Next, FIG. 8 is a timing chart describing a sixth operation example of the fault detection circuit according to the first embodiment. The sixth operation example is an example in which an oscillation abnormality occurs. The oscillation abnormality is an abnormality in which the frequency of the drive signal Ds4 becomes high.

As shown in FIG. 8, in this case, the operation of the phase difference detection circuit 51 and the smoothing circuits 53 and 54, which generate the phase difference detection voltages PF1s and PF2 for comparing the phase differences between the drive signals Ds1 and Ds2, is the same as that shown in the timing chart shown in FIG. 3, so the description thereof is omitted here.

On the other hand, in the example shown in FIG. 8, the frequency of the drive signal Ds4 becomes about twice that of the drive signal Ds3, and the falling timings of the drive signal Ds3 and the drive signal Ds4 become almost the same. Therefore, in the example shown in FIG. 8, the phase difference detection signal PF3 has a waveform in which it rises only for a moment. Also in the example shown in FIG. 8, the phase difference detection signal PF4 maintains a low level as in the example shown in FIG. 3 with a duty ratio of 0%.

In the fault detection circuit 50, the phase difference detection signals PF3 and PF4 are smoothed by the smoothing circuits 55 and 56 to generate the phase difference detection voltages PF3s and PF4s having voltage values obtained by multiplying the power supply voltage by the duty ratio. In the example shown in FIG. 8, the phase difference detection voltage PF3s is substantially about 0.0 V, because the duty ratio of the phase difference detection signal PF3 is extremely small, and the phase difference detection voltage PF4s maintains 0.0 V.

Next, the fault detection circuit 50 sets the abnormality detection signal ER1 to a high level because the phase difference detection voltages PF1s and PF3s input to the comparison circuit 58 of the error detection circuit 57 are shifted. Moreover, the abnormality detection signal ER2 becomes a low level, because the phase difference detection voltages PF2s and PF4s input to the comparison circuit 59 are the same voltage. Thus, when an oscillation abnormality occurs in which the frequency of the drive signal Ds4 is shifted from those of other drive signals, the fault detection circuit 50 sets the abnormality detection signal ER1 to a high level and the abnormality detection signal ER2 to a low level.

Figure 9:
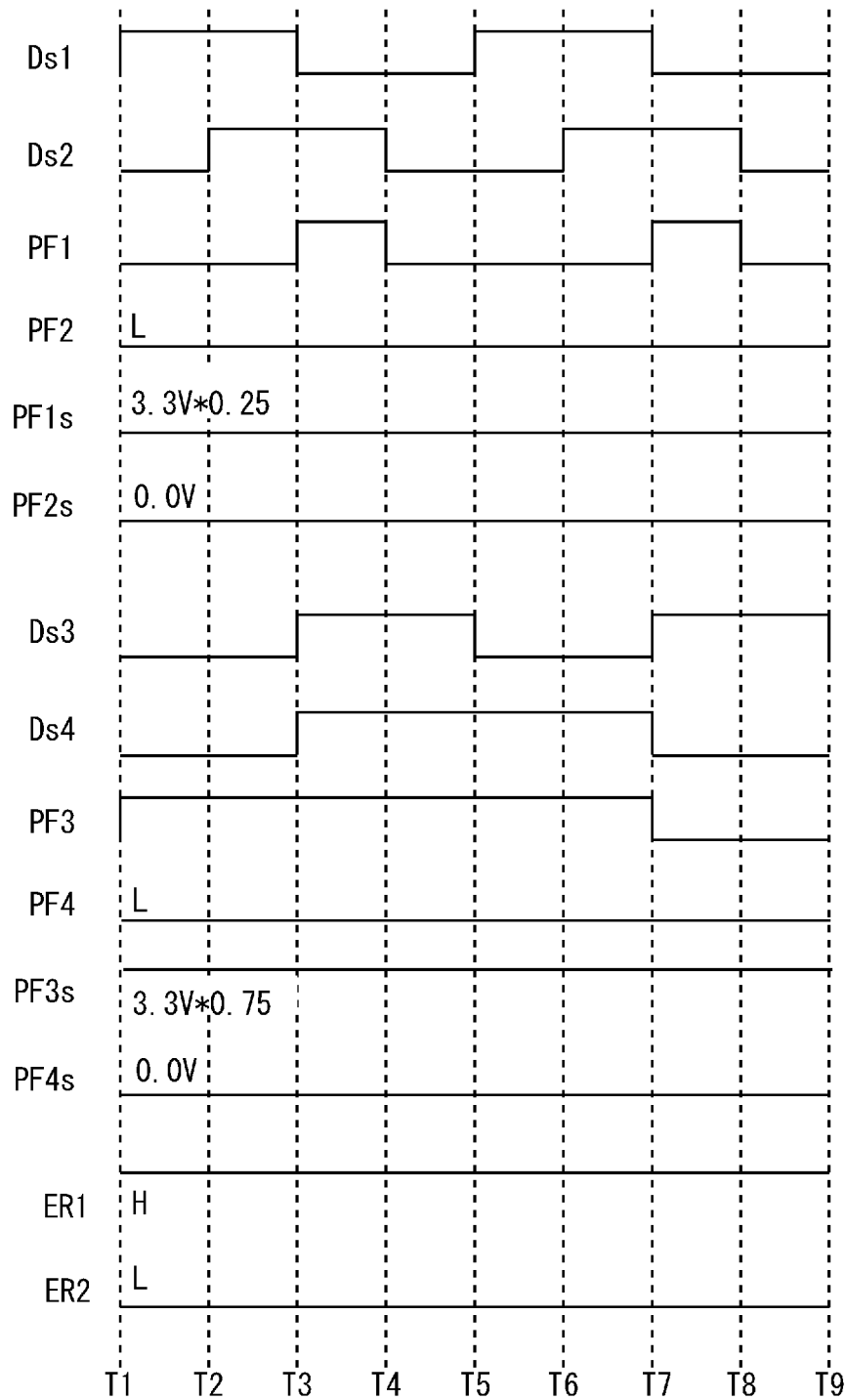
FIG. 9 is a timing chart describing a seventh operation example of the fault detection circuit according to the first embodiment.

Next, FIG. 9 is a timing chart for describing a seventh operation example of the fault detection circuit according to the first embodiment. The seventh operation example is an example in which an oscillation abnormality occurs. The oscillation abnormality is an abnormality in which the frequency of the drive signal Ds4 becomes low.

As shown in FIG. 9, in this case, the operation of the phase difference detection circuit 51 and the smoothing circuits 53 and 54, which generate the phase difference detection voltages PF1s and PF2 for comparing the phase differences between the drive signals Ds1 and Ds2, is the same as that shown in the timing chart shown in FIG. 3, so the description thereof is omitted here.

On the other hand, the example shown in FIG. 9 shows that the frequency of the drive signal Ds4 is about ½ times that of the drive signal Ds3. In the example shown in FIG. 9, the phase difference detection signal PF3 rises at the falling timing of the drive signal Ds3 at the timing T1 and maintains a high level until the falling timing of the drive signal Ds4 at the timing T7. Thus, in the example shown in FIG. 8, the duty ratio of the phase difference detection signal PF3 becomes 75%. Also in the example shown in FIG. 8, the phase difference detection signal PF4 maintains the low level and the duty ratio becomes a signal of 0% as in the example shown in FIG. 3.

In the fault detection circuit 50, the phase difference detection signals PF3 and PF4 are smoothed by the smoothing circuits 55 and 56 to generate the phase difference detection voltages PF3s and PF4s having voltage values obtained by multiplying the power supply voltage by the duty ratio. In the example shown in FIG. 6, the phase difference detection voltage PF3s becomes 3.3 V×0.75, and the phase difference detection voltage PF4s maintains 0.0 V.

Next, the fault detection circuit 50 sets the abnormality detection signal ER1 to a high level because the phase difference detection voltages PF1s and PF3s input to the comparison circuit 58 of the error detection circuit 57 are shifted. Moreover, the abnormality detection signal ER2 becomes a low level, because the phase difference detection voltages PF2s and PF4s input to the comparison circuit 59 are the same voltage. Thus, when an oscillation abnormality occurs in which the frequency of the drive signal Ds4 is shifted from those of other drive signals, the fault detection circuit 50 sets the abnormality detection signal ER1 to a high level and the abnormality detection signal ER2 to a low level.

From the above description, by using the fault detection circuit 50 according to the first embodiment, short-circuit faults, output voltage abnormalities (duty ratio abnormalities of the drive signal), and oscillation abnormalities that occur in the switching power supplies 10 to 40 constituting the multi-phase power supply 1 are detected. Thus, in the multi-phase power supply apparatus 1, safety can be enhanced by switching the operation mode when an abnormality is detected.

In the above explanation, the fault detection circuit 50 applied to the multi-phase power supply 1 of 4-phase drive has been described, but by changing the phase difference detection circuit in the fault detection circuit 50, the number of smoothing circuits, and the combination of drive signals input to one phase difference detection circuit, it is possible to support, for example, a multi-phase power supply of 3-phase drive or a multi-phase power supply of 5 or more drive signals.

Second Embodiment

In a second embodiment, a fault detection circuit 60, which is another form of the fault detection circuit 50 according to the first embodiment, is described. In the description of the second embodiment, the same signs as those of the first embodiment are used for the first embodiment and the trouble detection component, and the explanation is omitted.

Figure 10:
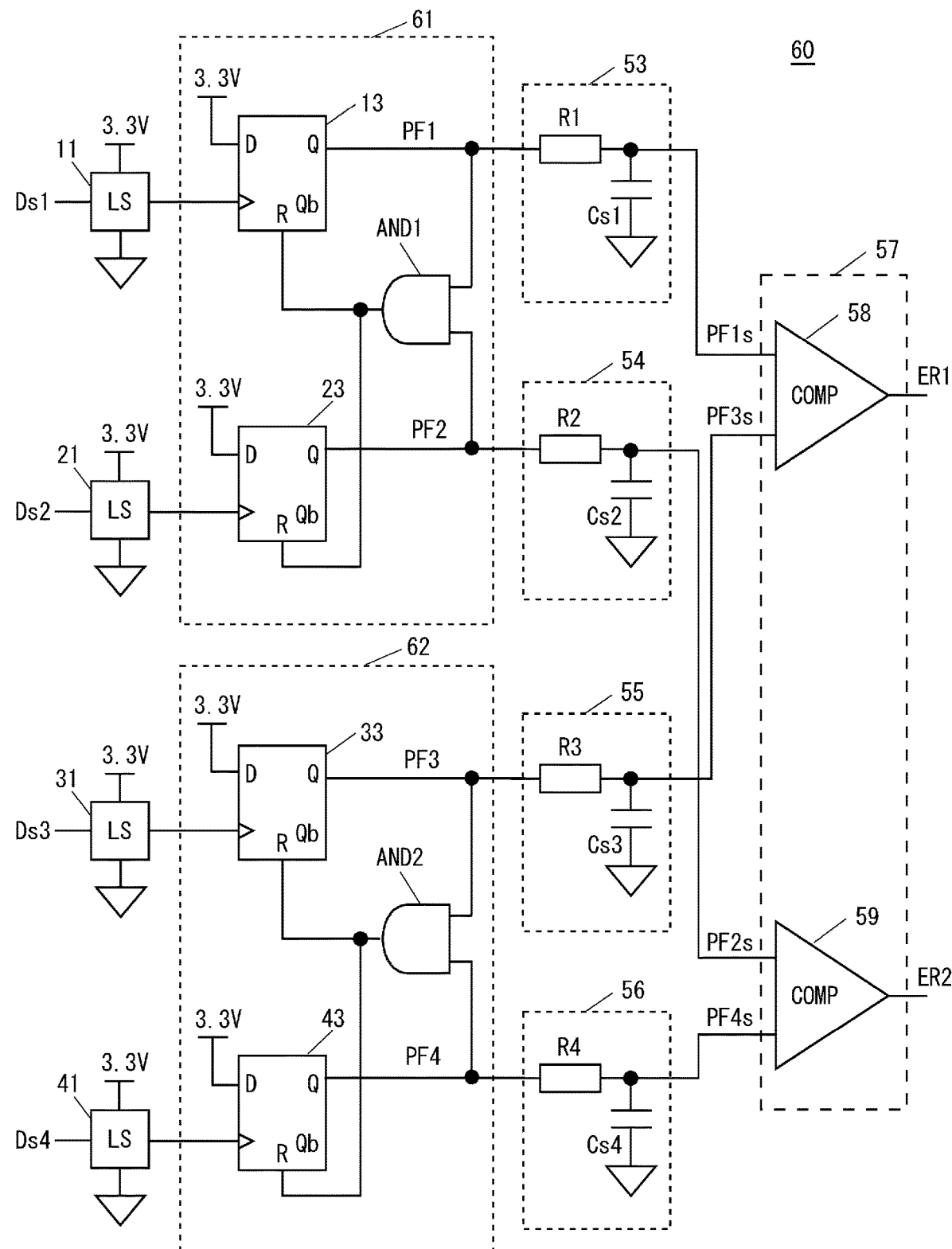
FIG. 10 is a block diagram of a fault detection circuit according to a second embodiment.

FIG. 10 is a block diagram of the fault detection circuit 60 according to the second embodiment. As shown in FIG. 10, in the fault detection circuit 60 according to the second embodiment, the phase difference detection circuits 51 and 52 of the fault detection circuit 50 according to the first embodiment are replaced with phase difference detection circuits 61 and 62. In the phase difference detection circuits 61 and 62, the JK flip-flops of the phase difference detection circuits 51 and 52 are replaced with D flip-flops. Even if the JK flip-flops are replaced with the D flip-flops in this way, the same operation as that of the fault detection circuit 50 according to the first embodiment can be performed.

In the fault detection circuit 60, a rising edge triggered D flip-flop is used as the D flip-flop. Thus, by using a rising edge triggered flip-flip, a phase difference detection signal corresponding to the magnitude of the phase difference between the two signals on the rising edge side can be generated.

In the example shown in FIG. 6, the phase difference detection circuit 61 has D flip-flops 13 and 23 and an AND gate AND1. In the D flip-flop 13, a power supply voltage is given to the input terminal D and the output of the AND gate AND1 is given to the reset terminal R. The drive signal Ds1 having an amplitude reduced by the level shift circuit 11 is input to the clock input terminal of the D flip-flop 13. Next, the D flip-flop 13 outputs the phase difference detection signal PF1 from the output terminal Q.

In the D flip-flop 23, the power supply voltage is given to the input terminal D, and the output of the AND gate AND1 is given to the reset terminal R. The drive signal Ds2 having an amplitude reduced by the level shift circuit 21 is input to the clock input terminal of the D flip-flop 23. Next, the D flip-flop 23 outputs the phase difference detection signal PF2 from the output terminal Q.

The phase difference detection circuit 62 has D flip-flops 33 and 43 and an AND gate AND2. In the D flip-flop 33, the power supply voltage is given to the input terminal D and the output of the AND gate AND2 is given to the reset terminal R. The drive signal Ds3 whose amplitude is reduced by the level shift circuit 31 is input to the clock input terminal of the D flip-flop 33. The D flip-flop 33 then outputs the phase difference detection signal PF3 from the output terminal Q.

In the D flip-flop 43, the power supply voltage is given to the input terminal D and the output of the AND gate AND2 is given to the reset terminal R. The drive signal Ds4 with an amplitude reduced by the level shift circuit 41 is input to the clock input terminal of the D flip-flop 43. The D flip-flop 43 then outputs the phase difference detection signal PF4 from the output terminal Q.

Next, the operation of the fault detection circuit 60 according to the second embodiment is described. Since the operation of the fault detection circuit 60 is to change the duty ratio of the phase difference detection signal based on the phase difference between the rising edges of the drive signals and the change of the duty ratio of the phase difference detection signal, and the change in the duty ratio of the phase detection signal is in accordance with the fault detection circuit 50, only the case where the multi-phase power supply 1 is operating normally is described below.

Figure 11:
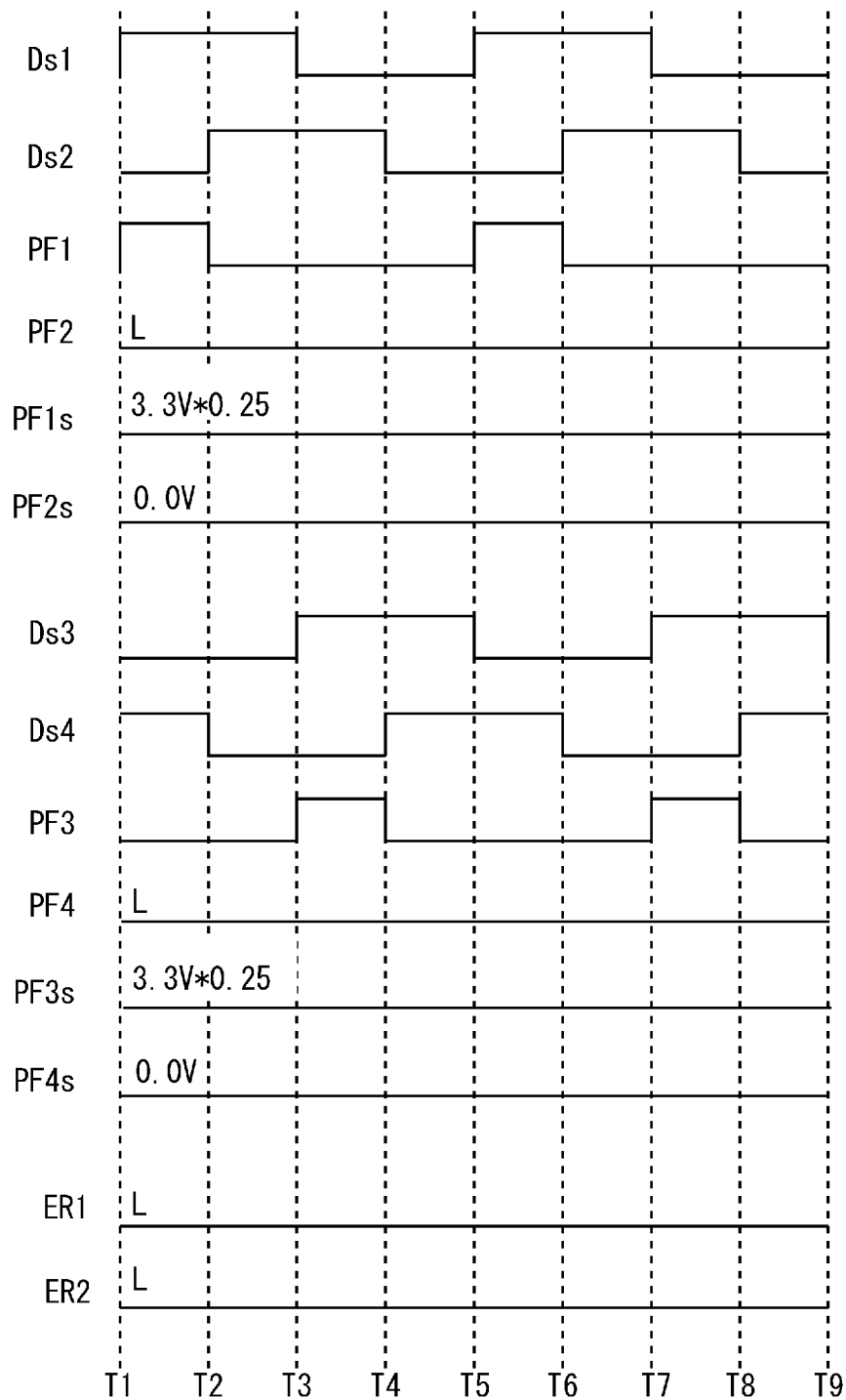
FIG. 11 is a timing chart describing a first operation example of the fault detection circuit according to the first embodiment.

FIG. 11 is a timing chart for describing a first operation example of the fault detection circuit according to the second embodiment. The first operation example is an operation example of the fault detection circuit 50 when the switching power supplies 10 to 40 are operating normally becomes low.

As shown in FIG. 11, when all the switching power supplies 10 to 40 are operating normally, in the fault detection circuit 60, the D flip-flop 13 raises the phase difference detection signal PF1 in response to the rising of the drive signal Ds1. In the fault detection circuit 60, the D flip-flop 23 raises the phase difference detection signal PF2 in response to the rising of the drive signal Ds2. When both the phase difference detection signal PF1 and the phase difference detection signal PF2 become a high level, the signal given by the AND gate AND1 to the reset terminals R of the D flip-flops 13 and 23 is switched from a low level to a high level, so that the phase difference detection signal PF1 is switched from a high level to a low level in response to the rising of the phase difference detection signal PF2. Moreover, since the high level phase difference detection signal PF2 is input to the reset terminal R of the D flip-flop 23 right after the rise, the waveform quickly becomes a low level and substantially maintains the low level.

With such an operation, the phase difference detection signal PF1 becomes a signal with a duty ratio of 25%, and the phase difference detection signal PF2 becomes a signal with a duty ratio of 0% while maintaining the low level. In the fault detection circuit 60, the phase difference detection signals PF1 and PF2 are smoothed by the smoothing circuits 53 and 54 to generate the phase difference detection voltages PF1s and PF2s having voltage values obtained by multiplying the power supply voltage by the duty ratio. In the example shown in FIG. 11, the phase difference detection voltage PF1s becomes 3.3 V×0.25, and the phase difference detection voltage PF2s maintains 0.0 V.

In the fault detection circuit 60, the D flip-flop 13 raises the phase difference detection signal PF3 in response to the rising of the drive signal Ds3. In the fault detection circuit 60, the D flip-flop 43 raises the phase difference detection signal PF4 in response to the rising of the drive signal Ds4. When both the phase difference detection signal PF3 and the phase difference detection signal PF4 become a high level, the signal given by the AND gate AND2 to the reset terminals R of the D flip-flops 33 and 43 is switched from a low level to a high level, so that the phase difference detection signal PF3 is switched from a high level to a low level in response to the rising of the phase difference detection signal PF4. Moreover, since the high level phase difference detection signal PF4 is input to the reset terminal R of the D flip-flop 43 right after the rise, the waveform quickly becomes a low level and substantially maintains the low level.

With such an operation, the phase difference detection signal PF3 becomes a signal with a duty ratio of 25%, and the phase difference detection signal PF4 becomes a signal with a duty ratio of 0% while maintaining the low level. In the fault detection circuit 60, the phase difference detection signals PF3 and PF4 are smoothed by the smoothing circuits 55 and 56 to generate the phase difference detection voltages PF3s and PF4s having voltage values obtained by multiplying the power supply voltage by the duty ratio. In the example shown in FIG. 11, the phase difference detection voltage PF3s becomes 3.3 V×0.25, and the phase difference detection voltage PF4s maintains 0.0 V.

In the fault detection circuit 60, since the phase difference detection voltages PF1s and PF3s input to the comparison circuit 58 of the error detection circuit 57 are the same voltage, the abnormality detection signal ER1 becomes a low level. In addition, since the phase difference detection voltages PF2s and PF4s input to the comparison circuit 59 are the same voltage, the abnormality detection signal ER2 becomes low level. In this way, the fault detection circuit 50 sets both the abnormality detection signals ER1 and ER2 to a low level if no fault is occurring in the switching power supplies 10 to 40.

From the above description, the fault detection circuit 60 achieves the same operation as that of the fault detection circuit 50 according to the first embodiment in a circuit using D flip-flops instead of JK flip-flops. Moreover, the fault detection circuit 60 can detect a phase difference of the rising edges of the drive signals by using a rising edge triggered flip-flop.

In the above description, an example of performing fault detection by separately detecting the phase difference of the rising edges and the phase difference of the falling edges of the drive signals has been described. However, the fault detection circuit 50 and the fault detection circuit 60 according to the first embodiment may be combined to detect the phase difference between the two drive signals on both the falling edge side and the falling edge side.

The program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (compact disc read only memory), CD-R (compact disc recordable), CD-R/W (compact disc rewritable), and semiconductor memories (such as mask ROM, PROM (programmable ROM), EPROM (erasable PROM), flash ROM, RAM (random access memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

What is claimed is:

1. A fault detection circuit for detecting an abnormality in drive signals of a plurality of drive circuits, the plurality of drive circuits being configured to drive a load circuit connected in series between an output terminal and ground wiring using the drive signals of different phases, the fault detection circuit comprising:
    a plurality of phase difference detection circuits each configured to generate a phase difference measurement signal having a pulse width corresponding to a magnitude of a phase difference between two of the drive signals of the different phases among the plurality of drive signals;
    a plurality of smoothing circuits each configured to smooth the phase difference measurement signal, which has been associated with the respective smoothing circuits in advance, and output a phase difference detection voltage having a voltage value corresponding to the magnitude of the phase difference; and
    an error detection circuit configured to compare the plurality of phase difference detection voltages and switch an abnormality detection signal from a disabled state to an enabled state when there is the phase difference detection voltage having a voltage value exceeding a preset tolerance range.

2. The fault detection circuit according to claim 1, wherein
    each of the plurality of phase difference detection circuits comprises:
        a first phase difference detection circuit configured to output a first phase difference measurement signal having a pulse width corresponding to the magnitude of the phase difference between two of the drive signals whose phases are adjacent to each other among the plurality of drive signals, and
        a second phase difference detection circuit configured to output a second phase difference measurement signal having a pulse width corresponding to the magnitude of the phase difference between two of the drive signals whose phases are delayed behind those of the drive signals for which the phases are to be compared by the first phase difference detection circuit and whose phases are adjacent to each other among the plurality of drive signals.

3. The fault detection circuit according to claim 2, wherein
    for a first drive signal and a second drive signal whose phase is delayed behind that of the first drive signal, the first phase difference detection circuit outputs, as the first phase difference measurement signal, a first phase difference determination signal indicating an amount of phase advance of the second drive signal from that of the first drive signal, and a second phase difference determination signal indicating an amount of phase delay of the second drive signal behind that of the first drive signal, and
    for a third drive signal whose phase is delayed behind that of the second drive signal and a fourth drive signal whose phase is delayed behind that of the third drive signal, the second phase difference detection circuit outputs, as the second phase difference measurement signal, a third phase difference determination signal indicating an amount of phase advance of the fourth drive signal from that of the third drive signal, and a fourth phase difference determination signal indicating an amount of phase delay of the fourth drive signal behind that of the third drive signal.

4. The fault detection circuit according to claim 3, wherein
    the first phase difference detection circuit outputs the first phase difference determination signal and the second phase difference determination signal based on one of a magnitude of a phase difference between a falling timing of the first drive signal and that of the second drive signal and a magnitude of a phase difference between a rising timing of the first drive signal and that of the second drive signal, and
    the second phase difference detection circuit outputs the third phase difference determination signal and the fourth phase difference determination signal based on one of a magnitude of a phase difference between a falling timing of the third drive signal and that of the fourth drive signal and a magnitude of a phase difference between a rising timing of the third drive signal and that of the fourth drive signal.

5. The fault detection circuit according to claim 3, wherein
    the error detection circuit compares a first phase difference detection voltage obtained by one of the plurality of smoothing circuits smoothing the first phase difference determination signal with a third phase difference detection voltage obtained by another one of the plurality of smoothing circuit smoothing the third phase difference determination signal, and switches a first abnormality detection signal included in the abnormality detection signal from the disabled state to the enabled state in response to an occurrence of a voltage difference between the two phase difference detection voltages, and the error detection circuit compares a second phase difference detection voltage obtained by one of the plurality of smoothing circuits smoothing the second phase difference determination signal with a fourth phase difference detection voltage obtained by another one of the plurality of smoothing circuit smoothing the fourth phase difference determination signal, and switches a second abnormality detection signal included in the abnormality detection signal from the disabled state to the enabled state in response to an occurrence of a voltage difference between the two phase difference detection voltages.

6. The fault detection circuit according to claim 1, further comprising a level shift circuit provided at a previous stage of the plurality of phase difference detection circuits configured to suppress an amplitude of the drive signal lower than or equal to an operating power supply voltage of the plurality of phase difference detection circuits.

7. The fault detection circuit according to claim 1, wherein the drive signal is a square-wave signal.

* * * * *